United States Patent
Lin et al.

(10) Patent No.: US 9,950,450 B2
(45) Date of Patent: Apr. 24, 2018

(54) MOLDING CHAMBER APPARATUS AND CURING METHOD

(71) Applicant: Taiwan Semiconductor Manufacturing Company, Ltd., Hsin-Chu (TW)

(72) Inventors: Jing-Cheng Lin, Hsin-Chu (TW); Chen-Hua Yu, Hsin-Chu (TW); Shin-Puu Jeng, Hsin-Chu (TW); Jui-Pin Hung, Hsin-Chu (TW); Hsien-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 517 days.

(21) Appl. No.: 14/527,598

(22) Filed: Oct. 29, 2014

(65) Prior Publication Data

US 2015/0050783 A1     Feb. 19, 2015

Related U.S. Application Data

(62) Division of application No. 13/270,957, filed on Oct. 11, 2011.

(51) Int. Cl.
*B29C 35/08* (2006.01)
*H05B 6/64* (2006.01)
(Continued)

(52) U.S. Cl.
CPC ........ *B29C 35/0805* (2013.01); *H01L 21/565* (2013.01); *H05B 6/6491* (2013.01); *H05B 6/806* (2013.01); *B29C 2035/0855* (2013.01)

(58) Field of Classification Search
CPC . B29C 35/08; B29C 35/0805; B29C 35/0888; B29C 43/3607; B29C 43/18; B29C 43/183; B29C 43/184; B29C 43/34; B29C 2043/3483; B29C 70/70; B29C 70/72; B29C 37/0075; H05K 13/0046; H05K 2203/13; H05K 2203/1311; H05K 2203/1322; H05K 3/28; H05K 3/284; H01L 21/56; H01L 21/565; H01L 21/566
(Continued)

(56) References Cited

U.S. PATENT DOCUMENTS 3,551,090 A    12/1970   Brumfield et al.
4,323,745 A     4/1982   Berggren
(Continued)

FOREIGN PATENT DOCUMENTS

EP           193514 A2     9/1986
JP       2008244418 A   * 10/2008

*Primary Examiner* — Timothy Kennedy
(74) *Attorney, Agent, or Firm* — Slater Matsil, LLP

(57) ABSTRACT

An embodiment is a molding chamber. The molding chamber comprises a mold-conforming chase, a substrate-base chase, a first radiation permissive component, and a microwave generator coupled to a first waveguide. The mold-conforming chase is over the substrate-base chase, and the mold-conforming chase is moveable in relation to the substrate-base chase. The first radiation permissive component is in one of the mold-conforming chase or the substrate-base chase. The microwave generator and the first waveguide are together operable to direct microwave radiation through the first radiation permissive component.

20 Claims, 3 Drawing Sheets

(51) Int. Cl.
  *H05B 6/80*   (2006.01)
  *H01L 21/56*  (2006.01)
(58) Field of Classification Search
  USPC .......... 264/271.1, 272.11, 272.17, 489, 490;
  425/174, 174.4, 110, 111
  See application file for complete search history.

(56) References Cited

U.S. PATENT DOCUMENTS

| | | |
|---|---|---|
| 6,743,389 B2 | 6/2004 | Miyajima et al. |
| 2001/0054775 A1 | 12/2001 | Nandu et al. |
| 2009/0014918 A1* | 1/2009 | Zheng .................... B29C 43/18 264/432 |

* cited by examiner

MOLDING CHAMBER APPARATUS AND CURING METHOD

This application is a divisional of U.S. patent application Ser. No. 13/270,957, filed on Oct. 11, 2011 (Abandoned), entitled "Molding Chamber Apparatus and Curing Method," which application is hereby incorporated herein by reference in its entirety.

BACKGROUND

Generally, once a semiconductor wafer has gone through the front end of line and back end of line processing to form semiconductor devices and their respective connections, dies singulated from the semiconductor wafer or the semiconductor wafer itself is typically coated with a resin in order to further protect the dies from physical and environmental damage.

In some solutions, the resin is applied using compression molding. In these solutions, a package including a die, the die alone, or the semiconductor wafer is inserted into a molding chamber. The resin is dispensed on the device generally without a particular shape. Components of the chamber are then brought together to compress the molding around the device thereby encapsulating the device with the compound.

In some instances, the molding compound must be cured to harden the compound and make the compound generally impervious to the exterior environment. During typical curing processes, stresses can be induced within the device structure, which may lead to device warpage or failure. Hence, the efficiency and yield of the molding process can be adversely affected.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a compression molding chamber and curing a molding compound. Other embodiments may also be applied, however, to other applications where curing a material, like a molding compound, using thermal properties is used, for example, wafer fan-out technology or three dimensional integrated circuit (3DIC) chip on wafer (CoW) technology.

Figure 1:
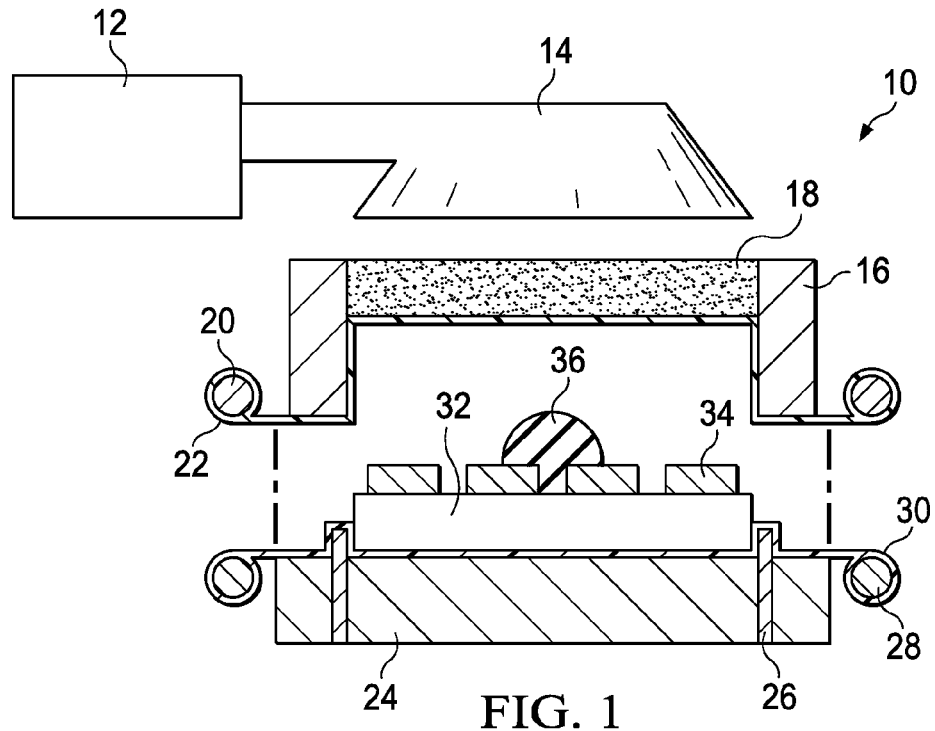
FIG. 1 is a molding chamber according to an embodiment.

FIG. 1 shows a molding chamber 10 according to an embodiment. The molding chamber 10 comprises a top chase 16, which may be a mold-conforming chase, and a bottom chase 24, which may be a substrate-base chase. A wave guide 14 is over the top chase 16, and the wave guide 14 is coupled to a microwave generator 12. The top chase 16 includes a radiation permissive component 18. The radiation permissive component 18 is over a volume in which molding compound will be when molding compression occurs and will be between the compressed molding and the wave guide 14. A top release film 22 is along inner surfaces of the top chase 16 and is applied using top rollers 20.

The bottom chase 24 includes guide pins 26 that align with recesses in the top chase 16 when molding compression occurs. A bottom release film 30 is along inner surfaces of the bottom chase 24 and is applied using bottom rollers 28, although the bottom release film 30 and the bottom rollers 28 may be omitted in other embodiments. A carrier substrate 32 is on the bottom chase 24 with the bottom release film 30 between the carrier substrate 32 and the bottom chase 24. Dies 34 are spaced apart from each other and are on the carrier substrate 32. A molding compound 36 is dispensed on an area of the carrier substrate 32 before molding compression occurs.

The radiation permissive component 18 allows microwave radiation to pass through. In this embodiment, the radiation permissive component 18 is quartz, the like, or a combination thereof. Other components of the top chase 18 and/or the bottom chase 24 can comprise, for example, materials that are acceptable in the art, such as a metal. Each of the release films 22 and 30 can be a Teflon film, the like, or a combination thereof.

The carrier substrate 32 can include, for example, glass, silicon oxide, aluminum oxide, silicon wafer substrate, the like, or a combination thereof. The dies 34 comprise various materials used for semiconductor processing, such as silicon, germanium, silicon-based materials like silicon nitride and/or silicon oxide, metals, etc. The molding compound 36 in this embodiment is a polymer, such as an epoxy, the like, or a combination thereof.

Figure 2:
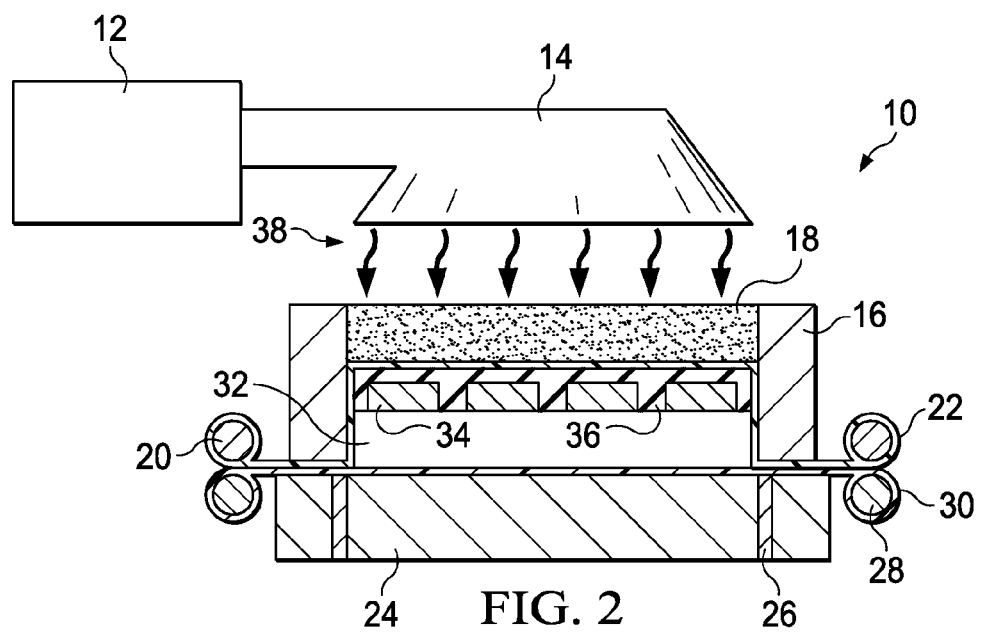
FIG. 2 is an illustration of the molding chamber of FIG. 1 compressing and curing molding compound according to an embodiment.

As shown in FIG. 2, the top chase 16 is brought together with the bottom chase 24 to compress the molding compound 36 and encapsulate the dies 34 with the molding compound 36. The microwave generator 12 begins to generate microwave radiation 38 which the waveguide 14 directs downward toward the molding compound 36. The microwave radiation 38 passes through the radiation permissive component 18 to the compressed molding compound 36. The microwave radiation 38 heats the molding compound 36 to cure the molding compound 36.

The microwave generator 12 in this embodiment generates microwave radiation 38 with a variable frequency. The frequency of the microwave radiation 38 in an embodiment can be, for example, in a range from approximately 1 Gigahertz (GHz) to approximately 8 GHz. The frequency can be varied, for example, as a sine function of time. In other embodiments, the frequency is varied using a sawtooth function, a square wave function, the like, or a combination thereof. The microwave radiation 38 can have a power between approximately 500 Watts (W) and approximately 1600 W. The frequency can be varied by a continuous sweep or by discreet steps. In this embodiment, the frequency is varied using a sine wave function with a bandwidth of approximately 1.15 GHz with the function ranging from approximately 5.275 GHz to approximately 7.575 GHz with a center frequency of 6.425 GHz by discreetly stepping through the frequency range at approximately 4096 steps per second at approximately 500 W. The microwave radiation 38 is applied for 10 minutes to a temperature of approximately 100° Celsius. Other embodiments contemplate different parameters for the microwave radiation 38, which can be optimized by routine experimentation, such as by testing a cure degree of molding compound, a modulus, a coefficient of thermal expansion (CTE), and a glass transition temperature ($T_g$).

Figure 3:
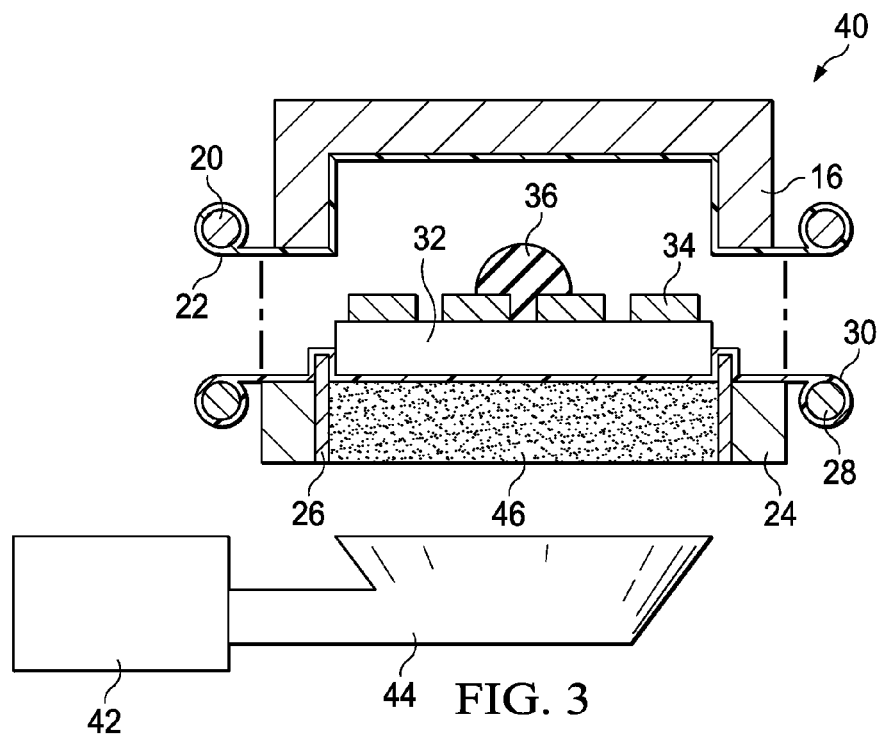
FIG. 3 is another molding chamber according to an embodiment.

FIG. 3 shows another molding chamber 40 according to an embodiment. The molding chamber 40 is similar to the molding chamber 10 of FIG. 1. The top chase 16 in FIG. 3 does not comprise the radiation permissive component 18, and the molding chamber 40 does not comprise the microwave generator 12 and waveguide 14 over the top chase. In FIG. 3, a microwave generator 42 and waveguide 44 is under the bottom chase 24. The bottom chase 24 in FIG. 3 comprises a radiation permissive component 46 under a volume in which molding compound will be when molding compression occurs and will be between the compressed molding and the wave guide 44. The materials of components in the molding chamber 40 can be the same or similar materials as discussed for corresponding components in the molding chamber 10 of FIG. 1.

Figure 4:
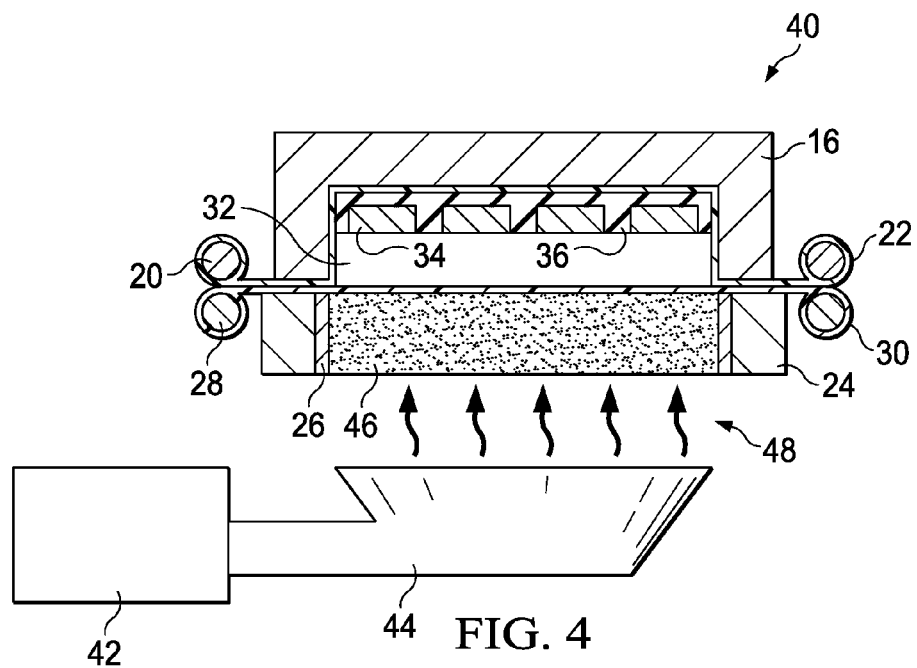
FIG. 4 is an illustration of the molding chamber of FIG. 3 compressing and curing molding compound according to an embodiment.

As shown in FIG. 4, the top chase 16 is brought together with the bottom chase 24 to compress the molding compound 36 and encapsulate the dies 34 with the molding compound 36. The microwave generator 42 begins to generate microwave radiation 48 which the waveguide 44 directs upward toward the molding compound 36. The microwave radiation 48 passes through the radiation permissive component 46 to the compressed molding compound 36. The microwave radiation 48 heats the molding compound 36 to cure the molding compound 36. The microwave generator 42 can generate microwave radiation 48 as discussed previously with regard to FIG. 2.

Figure 5:
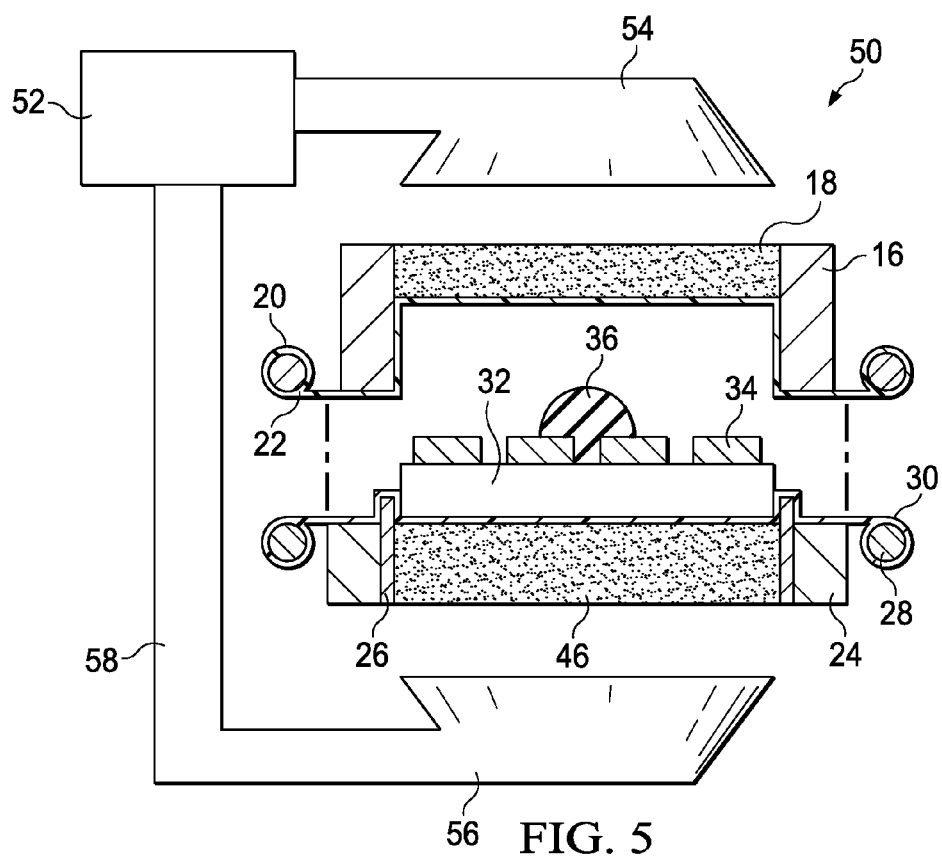
FIG. 5 is yet another molding chamber according to an embodiment.

FIG. 5 shows another molding chamber 50 according to an embodiment. The molding chamber 50 includes features of both the molding chamber 10 of FIG. 1 and the molding chamber 40 of FIG. 3. The top chase 16 includes the radiation permissive component 18, and the bottom chase 24 includes the radiation permissive component 46. A top waveguide 54 is over the top chase 16 and the radiation permissive component 18, and a bottom waveguide 56 is under the bottom chase 24 and the radiation permissive component 46. The top waveguide 54 is coupled to a microwave generator 52. The bottom waveguide 56 is coupled to the microwave generator 52 by coupling component 58. The coupling component 58 may be moveable or compressible to maintain spacing between the bottom waveguide 56 and the bottom chase 24 and/or between the top waveguide 54 and the top chase 16.

Figure 6:
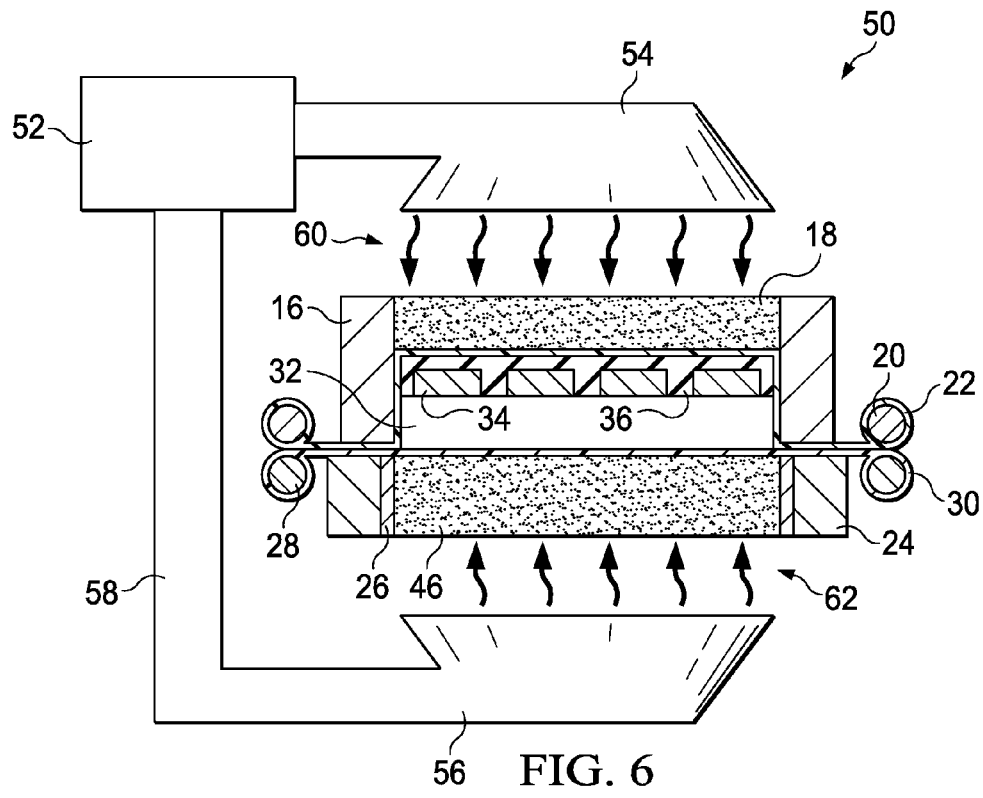
FIG. 6 is an illustration of the molding chamber of FIG. 5 compressing and curing molding compound according to an embodiment.

As shown in FIG. 6, the top chase 16 is brought together with the bottom chase 24 to compress the molding compound 36 and encapsulate the dies 34 with the molding compound 36. The microwave generator 52 begins to generate microwave radiation 60 which the top waveguide 54 directs downward toward the molding compound 36 and begins to generate microwave radiation 62 which the bottom wave guide 56 directs upward toward the molding compound 36. The microwave radiation 60 and the microwave radiation 62 passes through the radiation permissive component 18 and the radiation permissive component 46, respectively, to the compressed molding compound 36. The microwave radiation 60 and 62 heats the molding compound 36 to cure the molding compound 36. The microwave generator 52 can generate microwave radiation 60 and 62 as discussed previously with regard to FIGS. 2 and 4. In an embodiment, the phase of the microwave radiation 60 and 62 are adjusted so that the waves do not cancel each other out at the molding compound. It should be noted that the embodiment in FIGS. 5 and 6 can comprise separate microwave generators for the top waveguide 54 and the bottom waveguide 56.

Embodiments may achieve advantages. Using microwave radiation to cure molding compound can allow the molding compound to be heated without causing dies or a carrier substrate to be heated directly from the radiation. The materials of the dies or carrier substrate may be such that the materials absorb less energy from the radiation and therefore may be heated less from the radiation. It should be noted that the dies or carrier substrate may be heated from absorbing energy by conduction from the molding. Further, the heating may be more uniform in the molding compound. The temperature of the molding compound can be lower because the molding compound can be heated uniformly and efficiently. By having a lower temperature, the expansion difference of various materials caused by coefficient of thermal expansion (CTE) mismatch can be reduced. By reducing the expansion difference, warpage of packages can be reduced and allow for better wafer level processing by imparting less stress on a die or package. The process can also have a higher throughput due to lower processing times. Also, the molding compound can have a lower modulus to reduce the warpage of the packages.

An embodiment is a molding chamber. The molding chamber comprises a mold-conforming chase, a substrate-base chase, a first radiation permissive component, and a microwave generator coupled to a first waveguide. The mold-conforming chase is over the substrate-base chase, and the mold-conforming chase is moveable in relation to the substrate-base chase. The first radiation permissive component is in one of the mold-conforming chase or the substrate-base chase. The microwave generator and the first waveguide are together operable to direct microwave radiation through the first radiation permissive component.

Another embodiment is a molding chamber comprising a first chase, a first radiation permissive component in the first chase, a first waveguide, and a microwave generator coupled to the waveguide. The microwave generator and the first waveguide are operable to direct microwave radiation through the first radiation permissive component.

A further embodiment is method comprising applying a molding compound to a semiconductor substrate; conforming the molding compound to a surface of the semiconductor substrate; and curing the molding compound. The curing comprises directing microwave radiation to the molding compound.

Although the present embodiments and their advantages have been described in detail, it should be understood that various changes, substitutions and alterations can be made herein without departing from the spirit and scope of the disclosure as defined by the appended claims. For example, embodiments contemplate various applications of curing molding, such as in wafer level fan-out technology, wafer level chip on wafer technology, and the like.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   applying a molding compound on a carrier substrate, wherein the carrier substrate comprises a plurality of dies;
   after applying the molding compound, conforming the molding compound to a portion of the carrier substrate, wherein the conforming the molding compound comprises compressing the molding compound; and
   curing the molding compound, the curing comprising directing microwave radiation to the molding compound.

2. The method of claim 1, wherein the curing comprises using a microwave generator to generate the microwave radiation.

3. The method of claim 1, wherein the microwave radiation is directed through a radiation permissive component used, at least in part, during the conforming the molding compound.

4. The method of claim 1, wherein the microwave radiation has a variable frequency.

5. The method of claim 1, wherein a frequency of the microwave radiation oscillates in a subset or all of a range between 1 Gigahertz (GHz) and 8 GHz.

6. The method of claim 1, wherein a frequency of the microwave radiation is varied according to a sine function.

7. The method of claim 1, wherein a frequency of the microwave radiation is varied according to a sawtooth function.

8. The method of claim 1, wherein a frequency of the microwave radiation is varied according to a square wave function.

9. The method of claim 1, wherein a frequency of the microwave radiation is varied continuously.

10. The method of claim 1, wherein a frequency of the microwave radiation is varied in discrete steps.

11. The method of claim 1, wherein the directing the microwave radiation to the molding compound comprises directing the microwave radiation through the carrier substrate to the molding compound.

12. The method of claim 1, wherein the directing the microwave radiation to the molding compound comprises directing the microwave radiation from at least two distinct directions to the molding compound.

13. A method comprising:
    providing a carrier substrate with dies attached thereto on a substrate-base chase;
    applying a molding compound on the carrier substrate;
    compressing the molding compound by bringing the substrate-base chase together with a mold-conforming chase, the compressing the molding compound causing the molding compound to encapsulate the dies; and
    curing the molding compound, the curing comprising directing microwave radiation through at least one of the substrate-base chase and the mold-conforming chase.

14. The method of claim 13, wherein the directing the microwave radiation comprises varying a frequency of the microwave radiation.

15. The method of claim 13, wherein the microwave radiation is directed through a radiation-permissive component of the mold-conforming chase.

16. The method of claim 13, wherein the microwave radiation is directed through a radiation-permissive component of the substrate-base chase and through the carrier substrate.

17. A method comprising:
    applying a molding compound on a surface of a carrier substrate, the carrier substrate being on a substrate-base chase, dies being attached to the surface of the carrier substrate;
    conforming the molding compound with a mold-conforming chase, the conforming the molding compound encapsulating the dies with the molding compound, the conforming including bringing the substrate-base chase together with the mold-conforming chase; and
    curing the molding compound, the curing comprising using microwave radiation, the microwave radiation having a frequency that is varied during the curing.

18. The method of claim 17, wherein during the curing, the microwave radiation is directed through a radiation-permissive component of the mold-conforming chase.

19. The method of claim 17, wherein during the curing, the microwave radiation is directed through a radiation-permissive component of the substrate-base chase and through the carrier substrate.

20. The method of claim 1, wherein the conforming the molding compound comprises encapsulating the plurality of dies.

* * * * *